(12) United States Patent
Wang et al.

(10) Patent No.: US 12,244,329 B2
(45) Date of Patent: Mar. 4, 2025

(54) SPLIT INPUT AMPLIFIER FOR PROTECTION FROM DC OFFSET

(71) Applicant: Apple Inc., Cupertino, CA (US)

(72) Inventors: Hongrui Wang, San Jose, CA (US); Abbas Komijani, Mountain View, CA (US); Xinhua Chen, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/484,265

(22) Filed: Oct. 10, 2023

(65) Prior Publication Data
US 2024/0039564 A1 Feb. 1, 2024

Related U.S. Application Data

(63) Continuation of application No. 17/950,053, filed on Sep. 21, 2022, now Pat. No. 12,009,847, which is a continuation of application No. 17/690,867, filed on Mar. 9, 2022, now Pat. No. 11,894,866.

(51) Int. Cl.
*H04B 1/04* (2006.01)

(52) U.S. Cl.
CPC ....... *H04B 1/04* (2013.01); *H04B 2001/0408* (2013.01)

(58) Field of Classification Search
CPC ........ H03F 2200/451; H03F 3/66; H03F 3/68; H03F 3/72; H03F 3/45; H04B 1/04; H04B 2001/0408; H04B 2001/0416; H04B 2001/0425; H04B 2001/0433; H04B 2001/0441; H04B 2001/045; H04B 1/0458; H04B 1/0475; H04B 2001/0491
See application file for complete search history.

(56) References Cited

U.S. PATENT DOCUMENTS

| | | |
|---|---|---|
| 5,180,932 A | 1/1993 | Bengel |
| 5,504,782 A | 4/1996 | Campbell, Jr. |
| 6,489,845 B1 | 12/2002 | Maschhoff |
| 6,738,417 B1 | 5/2004 | Kim |
| 6,970,681 B2 | 11/2005 | Darabi |
| 7,551,023 B2 | 6/2009 | Ebner |

(Continued)

FOREIGN PATENT DOCUMENTS

EP 2779472 B1 4/2016

OTHER PUBLICATIONS

Extended European Search Report for European Patent Application No. EP23160449.7 dated Aug. 8, 2023; 11pgs.

*Primary Examiner* — Diana J. Cheng
(74) *Attorney, Agent, or Firm* — Fletcher Yoder, P.C.

(57) ABSTRACT

Embodiments presented herein provide apparatus and techniques to reduce a direct current (DC) voltage offset between a transmitter and receiver. Embodiments include a shared reference voltage signal generated by a reference voltage source. The receiver may include a first unit gain buffer to receive a reference voltage signal from the reference voltage source. The transmitter may be communicatively coupled to the receiver via one or more connections and may include a second unit gain buffer communicatively coupled to the first unit gain buffer via one of the connections. An amplifier (e.g., an operation amplifier) of the transmitter may include multiple positive inputs coupled to the second unit gain buffer and an offset tracker. The offset tracker may compensate for a DC offset caused by at least a power supply and/or a ground bounce.

20 Claims, 8 Drawing Sheets

(56) References Cited

U.S. PATENT DOCUMENTS

| | | |
|---|---|---|
| 7,747,892 B2 | 6/2010 | Boerstler et al. |
| 7,792,196 B2 | 9/2010 | Sheiman |
| 8,014,444 B1 | 9/2011 | Marino |
| 8,243,854 B2 | 8/2012 | Ikedo |
| 8,688,060 B2 | 4/2014 | Sudjian |
| 9,135,960 B2 | 9/2015 | Do |
| 9,207,692 B2 | 12/2015 | Khlat |
| 9,454,167 B2 | 9/2016 | Potanin et al. |
| 10,504,405 B2 | 12/2019 | Bae et al. |
| 11,231,732 B1 | 1/2022 | Prakash et al. |
| 2006/0223457 A1 | 10/2006 | Rahman |
| 2013/0328851 A1 | 12/2013 | Al-Dahle et al. |
| 2014/0226738 A1 | 8/2014 | Plevel et al. |
| 2017/0131797 A1 | 5/2017 | Lautzenhiser |

SPLIT INPUT AMPLIFIER FOR PROTECTION FROM DC OFFSET

CROSS-REFERENCE TO RELATED APPLICATION

This application is a continuation of U.S. patent application Ser. No. 17/950,053, entitled "SPLIT INPUT AMPLIFIER FOR PROTECTION FROM DC OFFSET," filed on Sep. 21, 2022, which is a continuation of U.S. patent application Ser. No. 17/690,867, entitled "SPLIT INPUT AMPLIFIER FOR PROTECTION FROM DC OFFSET," filed on Mar. 9, 2022, each of which is hereby incorporated by reference in its entirety for all purposes.

BACKGROUND

The present disclosure relates generally to wireless communication, and more specifically, relates to communication between integrated circuits in an electronic device.

Transceivers (e.g., intermediate frequency (IF) transceivers, baseband transceivers) within an electronic device may be coupled using a direct current (DC) link (e.g., a cable, such as a flexible flat cable). The DC link may enable improvements over an AC-coupled (e.g., alternating current or alternating coupled) path, such as reduced cost, lower latency, reduce noise, and un-fragmented DC/low frequency information. However, the DC link may be susceptible to DC offset, which may result in poorer signal quality (e.g., in terms of distortion of an eye diagram of a signal, increased jitter, and bit error rate degradation). The DC offset may be influenced (e.g., caused or exacerbated) by a reference voltage mismatch, a supply variation, ground bounce, and the like.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device is presented which includes a receiver configured to generate a reference voltage signal, and a transmitter coupled to the receiver. The transmitter may include an amplifier including a first input configured to receive the reference voltage signal via the receiver, and a second input, and offset tracking circuitry coupled to a second input of the amplifier, the offset tracking circuitry configured to compensate for a direct current voltage offset.

In another embodiment, a transmitter is presented which includes an amplifier including a first input and a second input, and offset tracking circuitry. The offset tracking circuitry configured to couple to the second input of the amplifier, and compensate for a voltage offset by tracking a supply variation associated with a power supply and a ground bounce associated with an electrical ground.

In yet another embodiment, an amplifier includes a first plurality of amplification stages coupled to offset tracking circuitry, the offset tracking circuitry configured to compensate for a voltage offset by tracking a supply variation associated with a power supply and a ground bounce associated with an electrical ground; and a second plurality of amplification stages coupled to a shared reference voltage supply, and configured to receive a shared reference voltage via the shared reference voltage supply.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
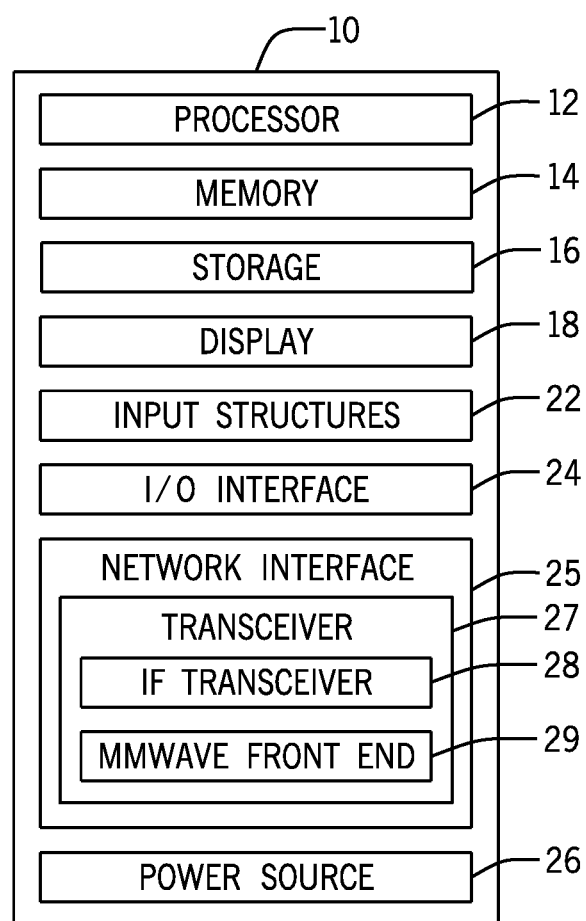
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the term "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

This disclosure is directed to reducing or mitigating a direct current offset between transceivers (e.g., intermediate frequency (IF) transceivers, baseband transceivers) which may be influenced (e.g., caused or exacerbated) by a reference voltage mismatch, a supply variation or transient, ground bounce, and the like. The reference voltage mismatch may refer to a difference between reference voltages used by the transceivers that are communicating within an electronic device. The supply variation may be caused by a deviation in a voltage output by a power supply due to a change in loading of the power supply. The ground bounce (e.g., noise) may be a ground potential mismatch between transceivers caused by a large transient current flowing through a cable with a finite resistance.

Embodiments include a shared reference voltage signal generated by a reference voltage source. The reference voltage source may be disposed in a transmitter or a receiver of the electronic device. The receiver may include a first unit gain buffer that receives a reference voltage signal via the reference voltage source. The transmitter may be communicatively coupled to the receiver via one or more intermediate frequency connectors (e.g., cables). The transmitter may include a second unit gain buffer communicatively coupled to the first unit gain buffer of the receiver via one of the intermediate frequency cables. An amplifier (e.g., an operational amplifier) of the transmitter may be coupled to the second unit gain buffer and an offset tracker. The offset tracker may compensate for a direct current voltage offset caused by at least a power supply and/or a ground bounce.

Advantageously, embodiments presented herein reduce or mitigate an occurrence of the reference voltage mismatch using a shared reference voltage between transceivers. Further, embodiments presented herein reduce or mitigate the supply variation and/or the ground bounce using an offset tracker that compensates for the corresponding DC offset. Advantageously, embodiments presented herein provide techniques and apparatus to reduce the DC offset while maintaining a low latency and a low bit error rate (BER) without additional protocol complexity or hardware overhead.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface (e.g., a wireless interface) 25, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network and/or wireless interface 25, and/or the power source 26 may each be communicatively coupled directly or indirectly (e.g., through or via another component, a communication bus, a wireless connection, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. In some cases, the electronic device 10 may be representative of a router, an end device, and/or a sleepy end device (SED) of a Thread® network, as discussed herein.

It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network and/or wireless interface 25. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network and/or wireless interface 25 may include, for example, one or more interfaces for a personal area network (PAN), such as a BLUETOOTH® network, for a local area network (LAN) or wireless local area network (WLAN), such as a network employing one of the IEEE 802.11x family of protocols (e.g., WI-FI®), for a low-rate wireless personal are network (LR-WPAN), such as employing the IEEE 802.15.4 protocol (e.g., a mesh network, such as a Thread® network), and/or for a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a satellite network, and so on. In particular, the network interface 25 may include, for example, one or more interfaces for using a Release-15 cellular communication standard of the 5G specifications that include the millimeter wave (mmWave) frequency range (e.g., 24.25-300 gigahertz (GHz)). The network interface 25 of the electronic device 10 may allow communication over the aforementioned networks (e.g., 5G, Wi-Fi, LTE-LAA, a mesh network such as a Thread® network, and so forth).

The network and/or wireless interface 25 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 25 may include a transceiver 27. In some embodiments, all or portions of the transceiver 27 may be disposed within the processor 12. The transceiver 27 may support transmission and receipt of various wireless signals via one or more antennas, and thus may include a transmitter and a receiver. In some embodiments, the transceiver 27 may include a 5G mmWave transceiver that supports transmission and receipt of 5G wireless signals. Such a transceiver 27 may include an intermediate frequency (IF) transceiver 28 and one or more mmWave front ends 29. The IF transceiver 28 may modulate an input baseband signal (e.g., sent from the processor 12, including a baseband processor) having a baseband frequency to an intermediate frequency to the one or more mmWave front ends 29 (e.g., via a connector, coupling, or cable). The one or more mmWave front ends 29 may then convert the IF signal to a carrier frequency and radiated by one or more antennas of the electronic device 10. In some embodiments, each of the IF transceiver 28 and the one or more mmWave front ends 29 may be disposed on its own integrated circuit.

The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device. In some embodiments, the power source 26 may include or be representative of a power management unit (PMU) which may control distribution of power throughout the electronic device 10. For example, the power management unit may control power supplied to various subsystems and/or components of the electronic device 10, shut down (e.g., turn off) the subsystems and/or components not currently being used, control sleep and/or power functions of the various subsystems and/or components.

Figure 2:
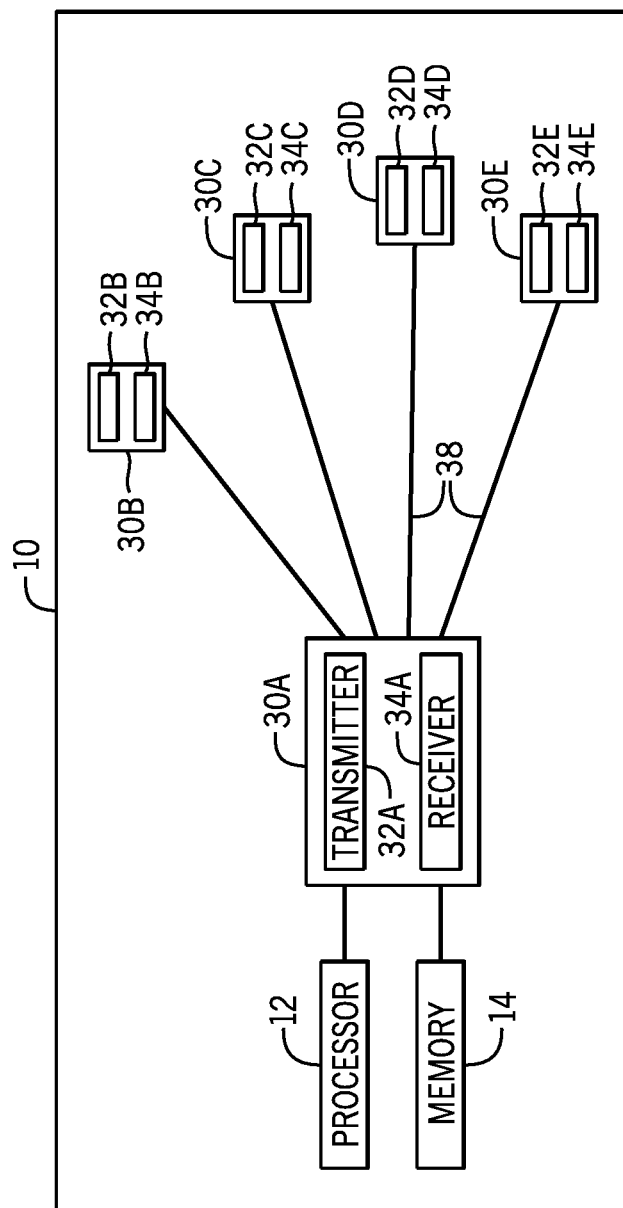
FIG. 2 is a block diagram of the electronic device of FIG. 1 including a number of transceivers and connectors for communication between the transceivers, according to embodiments of the present disclosure.

FIG. 2 is a block diagram of the electronic device 10 of FIG. 1 including a number of transceivers 30A-E (collectively 30) and connectors 38 for communication between the transceivers 30A-E, according to embodiments of the present disclosure. In particular, the transceivers 30A-E may be part of the IF transceiver 28 and/or the mmWave front ends 29, as shown in FIG. 1. For example, the transceiver 30A may be part of the IF transceiver 28, and each transceiver 30B-E may be part of an mmWave front end 29. The transceiver 30A may be communicatively coupled to transceiver 30B-E via the connectors 38. The connectors 38 may be representative of, for example, a cable, coupling, or other electrical interconnects. In some embodiments, each of the IF transceiver 28 and the one or more mmWave front ends 29 may be disposed on its own integrated circuit. As such, the connectors 38 may couple the IF transceiver 28 disposed on a first integrated circuit to the one or more mmWave front ends 29 disposed on one or more other integrated circuits. It should be understood that the electronic device 10 may include any suitable number of transceivers 30A-E for communication of various signals within.

The connectors 38 may be representative of a flexible connection between the integrated circuits (e.g., having the transceivers 30A-30E), such as flexible flat cables (FFCs). It should be understood that while one connector 38 is shown between each of the transceivers 30A-30E, any suitable number of cables may be included between one or more of the transceivers 30A-30E. Further, it should be understood that each connector 38 may enable one or more signals to propagate there through using multiplexing, such as frequency domain diplexing. For example, low frequency control signals (e.g., having a frequency below 1 gigahertz (GHz)) and high frequency data signals (e.g., having a frequency of 1 GHz or more, such as 10 GHz or more, 20 GHz or more, 30 GHz or more), may be communicated between the transceivers 30A-E via the connectors 38. In some embodiments, the connectors 38 may be used to transmit and/or receive signals having intermediate and/or baseband frequencies. That is, each of the transceivers 30A-30E may transmit and/or receive signals of various frequencies (e.g., low frequency and high frequency). As shown, each transceiver 30A-E includes a transmitter 32 and a receiver 34. As an example, the transmitter 32A may enable the transceiver 30A to transmit various signals to other transceivers 30B-E and the receiver 34A may enable the transceiver 30A to receive various signals from the other transceivers 30B-E.

Figure 3:
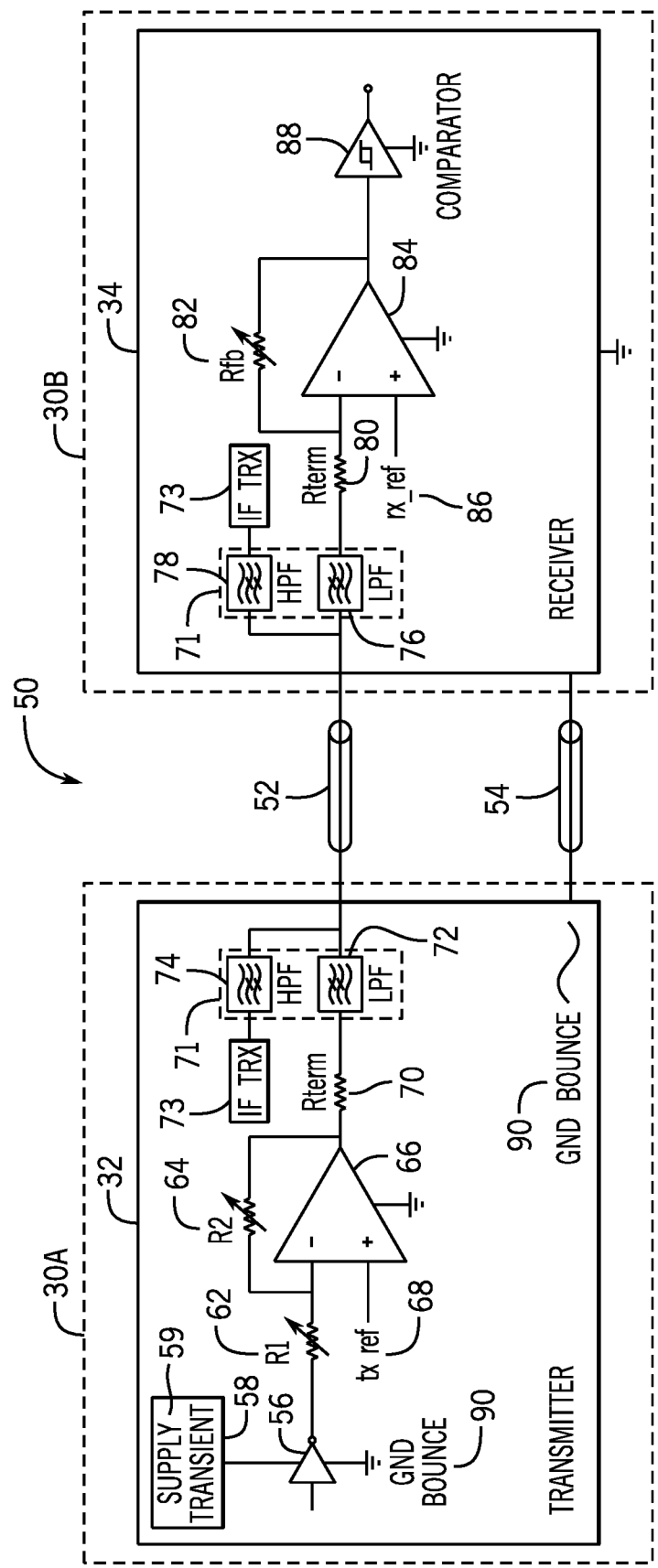
FIG. 3 is a schematic diagram of a communication system having the transceivers of the electronic device of FIG. 2 coupled via the connectors.

FIG. 3 is a schematic diagram of a communication system 50 having the transceivers 30 of the electronic device 10 of FIG. 2 coupled via one or more cables 52, 54. In particular, the communication system 50 includes a transmitter 32 and a receiver 34 coupled via one or more cables 52, 54. As illustrated, the transmitter 32 of FIG. 3 may be representative of the transmitter 32A in the intermediate frequency transceiver 30A of FIG. 2 and the receiver 34 of FIG. 3 may be representative of the receiver 34C of the transceiver 30C of FIG. 2, though the transmitter 32 and the receiver 34 of FIG. 3 may be representative of any of the transmitters 32A-E and of the receivers 34A-E, of FIG. 2, respectively.

The cables 52, 54 may be representative of the connectors 38 of FIG. 2. That is, the cables 52, 54 may be representative of a single connector 38 between the transmitter 32 and the receiver 34. In that case, signals propagated through that cable 52, 54 may include low frequency control signals (e.g., frequencies less than 1 GHz) and high frequency data signals (e.g., frequencies of tens of GHz) that are multiplexed on the cable 52, 54 using, for example, frequency domain diplexing. In other cases, the cables 52, 54 may be separate cables and that may each be used for a particular data type and/or frequency of signal. For example, the cable 52 may include an intermediate frequency cable or baseband frequency cable for transmitting data signals and/or control signals between the transmitter 32 and the receiver 34. As another example, the cable 54 may be used as a voltage supply and/or ground cable between the transmitter 32 and the receiver 34.

As shown, the transmitter 32 includes a transmission (TX) inverter 56 coupled to a power supply 58 which may introduce a supply transient 59 (e.g., a supply variation). An output of the inverter 56 is coupled to an amplifier based driver 66 (e.g., an operational amplifier (op-amp)) via a resistor divider including a first resistor R1 (e.g., an input resistor) 62 and a second resistor R2 (e.g., a feedback resistor) 64. In some embodiments, the resistors 62, 64 may include variable resistors and may set an amplification factor of the amplifier 66 to a resistance value of the second resistor 64 divided by a resistance value of the first resistor 62. The amplifier 66 may also receive a transmission reference voltage (tx_ref) 68, which may be generated internal to or external to the transmitter 32. The transmission reference voltage 68 may be used to convert an analog transmission signal to a digital transmission signal. An output of the amplifier 66 may be coupled to a termination resistor (Rterm) 70 and a diplexer 71. The diplexer 71 may include a low pass filter (LPF) 72 and a high pass filter (HPF) 74. As discussed above, the diplexer 71 may combine a control signal (e.g., filtered by the LPF 72) with an intermediate frequency signal (e.g., filtered by the HPF 74) that is transmitted to the receiver 34 via the cable 52. That is, the HPF 74 may receive an intermediate frequency transmission signal 73 (e.g., a data signal) to be transmitted to the receiver 34. In some cases, the diplexer 71 may utilize frequency domain multiplexing.

The receiver 34 also includes a diplexer 71 having a low pass filter (LPF) 76 and a high pass filter (HPF) 78. The diplexer 71 of the receiver 34 is coupled to a receive (RX) amplifier 84 (e.g., an op-amp) via a resistor divider including a termination resistor (Rterm) 80 and a variable resistor (Rfb) 82. If the diplexer 71 of the transmitter 32 combined a low voltage (e.g., control) signal and the transmission signal 73, the diplexer 71 of the receiver 34 may divide the combined signal into the low voltage signal and the transmission signal 73. In that case, the low voltage signal may propagate to the termination resistor 80 and the amplifier 84.

The amplifier 84 may also receive a receive reference voltage (rx_ref) 86 which may be generated internal to or external to the receiver 34. The receive reference voltage 86 may be used to convert an analog transmission signal from the transmitter 32 to a digital receive signal. An output of the amplifier 84 may be coupled to a comparator 88.

The high pass filters 74, 78 may enable high frequency (e.g., radio frequency (RF)) components of signals (e.g., data signals) to be transmitted between integrated circuits (e.g., having the transceivers 30A, 30B) via the intermediate frequency cable 52. The low pass filters 72, 76 may enable low frequency components (e.g., baseband components) of control signals transmitted between the transmitter 32 and the receiver 34 to pass through the cable 52. Positive terminals of the amplifiers 66, 84 may receive the respective reference voltage signals (e.g., tx_ref and rx_ref) 68, 86 which may define a common mode voltage of the transmitter 32 and the receiver 34, respectively. For example, the common mode voltage of the transmitter 32 may be represented by Equation 1 below:

$$V_{tx\_com} = \frac{R_1 + R_2}{R_1}(V_{tx\_ref} + V_{tx\_gnd}) - \frac{R_2}{R_1}\left(\frac{V_{sup}}{2} + V_{tx\_gnd}\right) \quad \text{(Equation 1)}$$

where $V_{sup}$ is a supply voltage to the transmitter inverter or buffer 56, and $V_{tx\_gnd}$ is the ground bounce 90 at the transmitter 32.

A DC offset voltage between the transmitter 32 and the receiver 34 may be determined based on a mismatch between the reference voltages 68, 86, a supply variation 59 (e.g., transient), and the ground bounce 90. The reference voltage 68, 86 mismatch may be a difference between the transmission reference voltage 68 and the receive reference voltage 86 represented by Equation 2 below:

$$V_{offset} = V_{tx\_ref} - V_{rx\_ref} \quad \text{(Equation 2)}$$

The supply variation 59 may be caused by a power management unit (PMU) having a supply ripple (e.g., a residual periodic variation of the supplied DC voltage derived from an alternating current (AC) source). The supply ripple may cause the variation 59 in the supply voltage and thus contribute to the DC offset. The supply variation 59 may be represented by Equation 3 below:

$$V_{offset} = -\frac{R_2}{R_1}\frac{\Delta V_{sup}}{2} \quad \text{(Equation 3)}$$

where R1 is the input resistor 62 of the TX op-amp 66, R2 is the feedback resistor 64 of the TX amplifier 66, and $\Delta V_{sup}$ is the supply variation 59 from a nominal voltage. The ground bounce 90 may be generated by a ground resistance of the supply/ground cable 54 between the transmitter 32 and the receiver 34. In some cases, the ground bounce 90 may be tens of millivolts (mV) (e.g., 10 mV, 20 mV, 30 mV, 40 mV, 50 mV, 60 mV, 70 mV, 80 mV, 90 mV, 100 mV, and the like) and may be represented by Equation 4 below:

$$V_{offset} = V_{tx\_gnd} \quad \text{(Equation 4)}$$

Figure 4A:
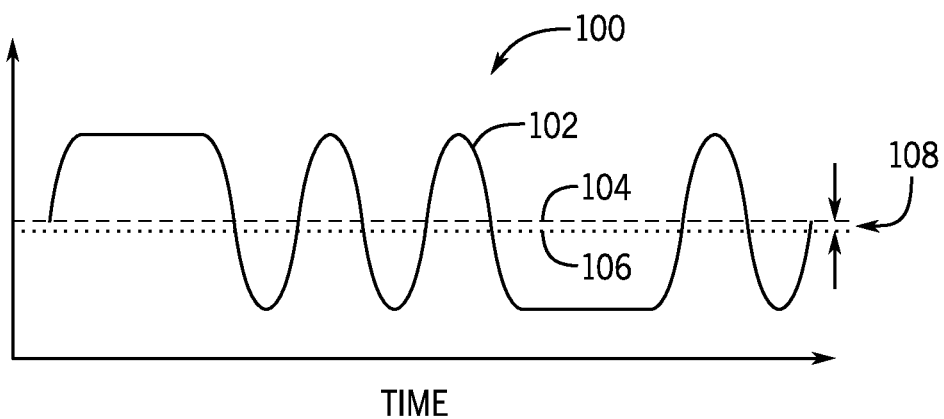
FIG. 4A is a timing diagram illustrating a direct current offset between the transceivers of FIG. 3 caused by a reference voltage mismatch, according to embodiments of the present disclosure.
Figure 4B:
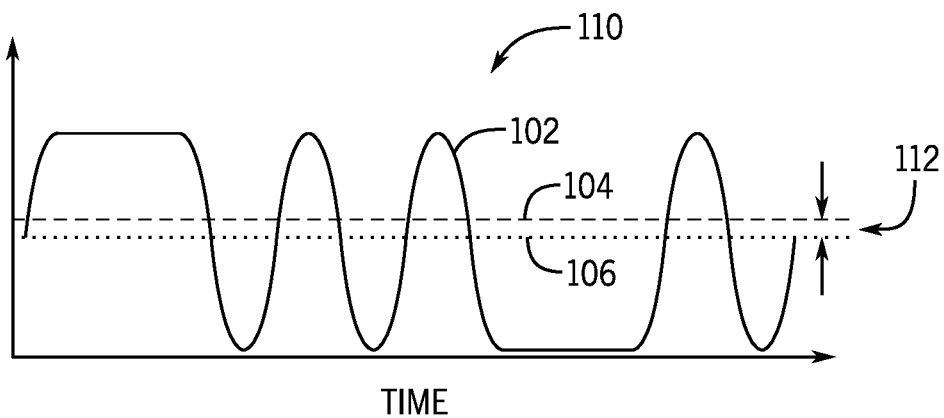
FIG. 4B is a timing diagram illustrating a direct current offset between the transceivers of FIG. 3 caused by a supply variation, according to embodiments of the present disclosure.
Figure 4C:
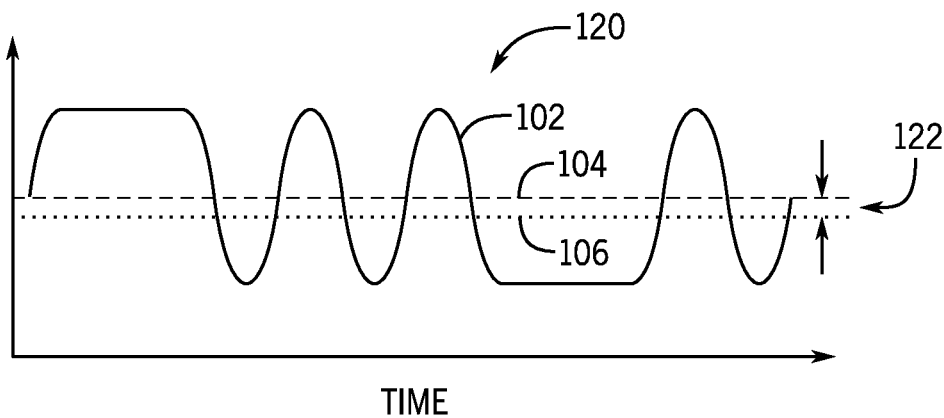
FIG. 4C is a timing diagram illustrating a direct current offset between the transceivers of FIG. 3 caused by a ground bounce, according to embodiments of the present disclosure.

FIGS. 4A-4C are timing diagrams depicting a direct current (DC) offset for a transmission signal between the transmitter 32 and the receiver 34 of FIG. 3, according to embodiments of the present disclosure. Each of FIGS. 4A-4C depicts a line 102 representing a transmitted signal from the transmitter 32 and the receiver 34 of FIG. 3 and a DC offset 108, 112, 122 between a TX common mode voltage 104 and the RX reference voltage 106, such as the RX reference voltage 86 of FIG. 3.

More specifically, FIG. 4A is a timing diagram 100 illustrating a DC offset 108 caused by a reference voltage mismatch, FIG. 4B is a timing diagram 110 illustrating a DC offset 112 caused by a supply variation 59, and FIG. 4C is a timing diagram 120 illustrating a DC offset 122 caused by the ground bounce 90. The larger the DC offset, the more affected the transmitted signal 102. For example, the DC offset 108 caused by the reference voltage mismatch is smaller than the DC offset 112 caused by the supply variation 59. As shown, a magnitude (e.g., amplitude) of the transmitted signal 102 in FIG. 4B is larger than the magnitude of the transmitted signal in FIG. 4A due to the larger DC offset 112 caused by the supply variation (compared to the smaller DC offset 108 caused by the reference voltage mismatch). As a result, any of the reference voltage mismatch, the supply variation 59, and/or the ground bounce 90 may cause some magnitude of a DC offset 112, and, when aggregated, may have a greater DC offset 112, which may significantly degrade signal quality (e.g., in terms of eye diagram distortion, increased jitter, and/or increased bit error rate).

Figure 5:
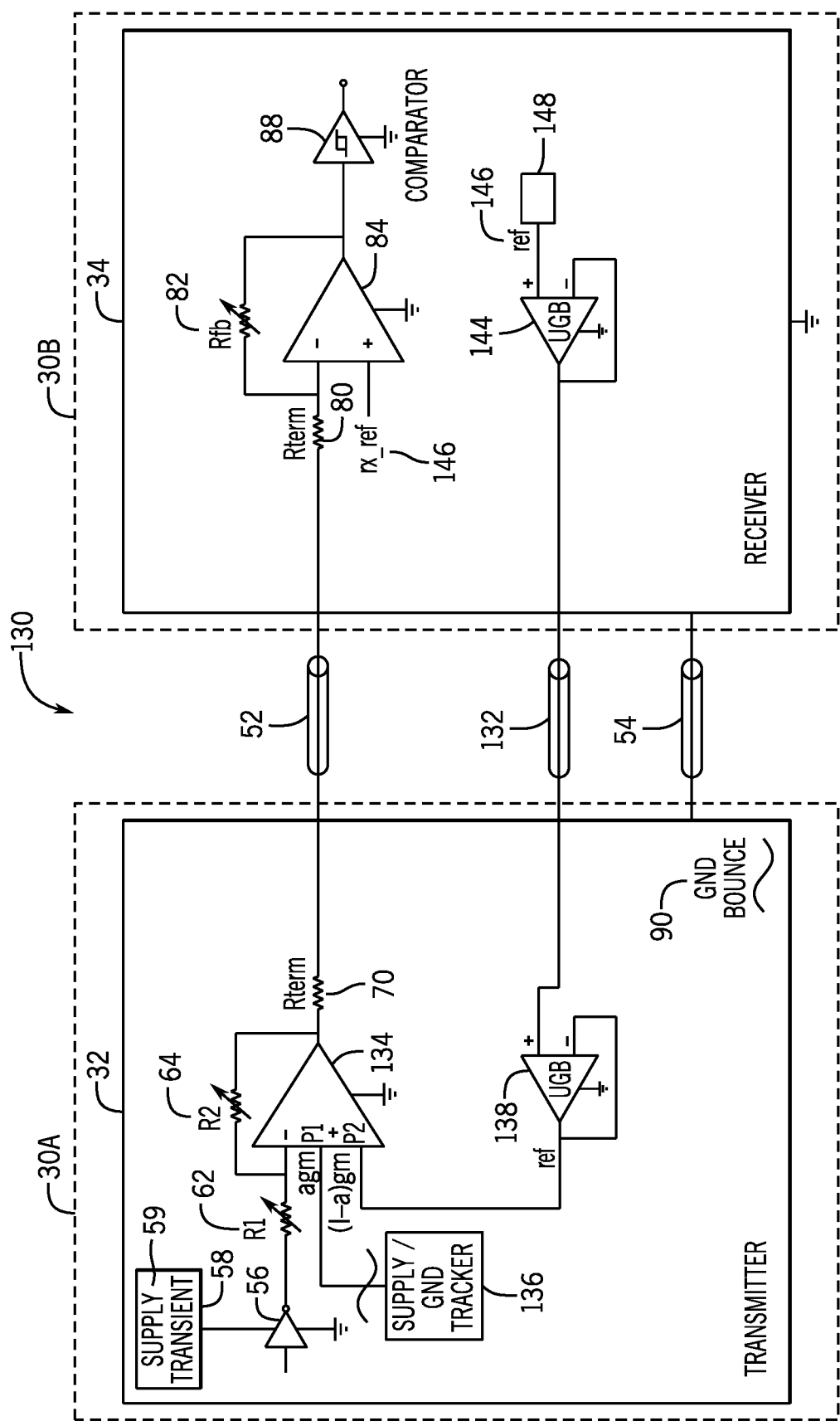
FIG. 5 is a schematic diagram of a communication system having the transceivers of the electronic device of FIG. 3 coupled via the connectors, illustrating a shared reference voltage signal, a multi-input amplifier, and an offset tracker, according to embodiments of the present disclosure.

FIG. 5 is a schematic diagram of a communication system 130 having the transceivers of FIG. 3 coupled via cables 52, 54, 132, including a shared reference voltage signal 146, a multi-input amplifier 134 (e.g., operational amplifier), and an offset tracker 136, according to embodiments of the present disclosure. In particular, the communication system 130 includes the transmitter 32 and the receiver 34 coupled via one or more cables 52, 54, 132. As illustrated, the transmitter 32 of FIG. 5 may be representative of the transmitter 32A in the intermediate frequency transceiver 30A of FIG. 2 and the receiver 34 of FIG. 5 may be representative of the receiver 34C of the transceiver 30C of FIG. 2, though the transmitter 32 and the receiver 34 of FIG. 5 may be representative of any of the transmitters 32A-E and any of the receivers 34A-E, of FIG. 2, respectively.

As shown, a single reference voltage (ref) 146 is shared between the transmitter 32 and the receiver 34 via an intermediate frequency (IF) reference voltage cable 132. In some cases, the shared reference voltage 146 may be transmitted between the transmitter 32 and the receiver 34 via an existing IF cable, such as the IF cable 52 (e.g., which may be in the form of a flexible flat cable). That is, because the shared reference voltage 146 is a low frequency DC signal, the shared reference voltage 146 may be multiplexed and transmitted with additional signals (e.g., low frequency control signals and/or high frequency signals).

As shown, the reference voltage 146 is generated within the receiver 34 at a voltage reference or other suitable reference voltage source 148 and transmitted to the transmitter 32. However, it should be understood that, in alternative embodiments, the reference voltage 146 may be generated in the transmitter 32 (or any other location in the electronic device 10 external to the receiver 34) and provided to the receiver 34 via the reference voltage cable 132. As shown, the reference voltage cable 132 is coupled to a first unit gain buffer (UGB) 144 at the receiver 34 and a second UGB 138 at the transmitter 32. Advantageously, the shared reference voltage 146 decreases or effectively removes any mismatch (e.g., DC offset) between the reference voltages used by the transmitter 32 and the receiver 34 discussed with respect to FIG. 3.

In the embodiment depicted in FIG. 5, the transmitter amplifier 134 is a multiple input op-amp having multiple positive terminals. For example, the amplifier 134 may have a pair of positive input terminals P1 and P2, denoted as parameters, a and 1−a, respectively, which may be programmable. A first positive terminal P1 of the amplifier 134 may be coupled to the offset tracker 136 (e.g., a supply/ground tracker) and a second positive terminal P2 may be coupled to the unit gain buffer 138 of the transmitter 32 and configured to receive the shared reference voltage signal 146. The offset tracker 136 may track the supply variation 59 and the ground bounce 90. In some cases, the voltage from the offset tracker 136 may be a voltage (e.g., a middle voltage) between the supply variation 59 and the ground bounce 90. In some embodiments, the offset tracker 136 may be implemented as one or more resistor dividers.

A total DC offset of the embodiment of FIG. 5 may be represented by Equation 5 below:

$$V_{offset} = \frac{R_1 + R_2}{R_1}(1-a)V_{ref} + \frac{R_1 + R_2}{R_1}a\left(\frac{V_{sup}}{2} + V_{tx\_gnd}\right) - \frac{R_2}{R_1}\left(\frac{V_{sup}}{2} + V_{tx_{gnd}}\right) - V_{ref} \quad \text{(Equation 5)}$$

If the voltage provided by the offset tracker 136 to the amplifier 134 is programmed to be $$a = \frac{R_2}{R_1 + R_2},$$

the supply and ground bounce transfer function is zero and thus the DC offset becomes zero. That is, the offset tracker 136 may be programmed to effectively nullify the supply variation 59 and the ground bounce 90 at the output of the transmitter 32. An effectiveness of the DC offset cancellation may be determined based on a resistor ratio of the input resistor (R1) 62 and the feedback resistor (R2) 64 of the TX amplifier 134. Further, in some embodiments, a bandwidth of the reference voltage cable 132 may be higher than the ground bounce 90 frequency content.

As shown, the communication system 130 of FIG. 5 does not include the diplexers 71 of FIG. 3. That is, the embodiment of FIG. 5 may reduce or mitigate an effect of the DC offset for a control signal transmitted between the transmitter 32 and the receiver 34. Advantageously, the shared reference voltage 146 may compensate for the reference voltage mismatch and thus substantially reduce or mitigate the DC offset caused by the reference voltage mismatch. The offset tracker 136 and the multi-input amplifier 134 may compensate for and thus substantially reduce or mitigate the DC offset caused by the supply variation 59 and the ground bounce 90. That is, embodiments presented herein substantially reduce the DC offset and improve or maintain a low latency and a low bit error rate (BER) without additional protocol complexity. As discussed above, the shared reference voltage 146 may be transmitted between the transmitter 32 and receiver 34 via an existing cable. Thus, the embodiments presented herein reduce or mitigate the DC offset without additional hardware overhead.

Figure 6:
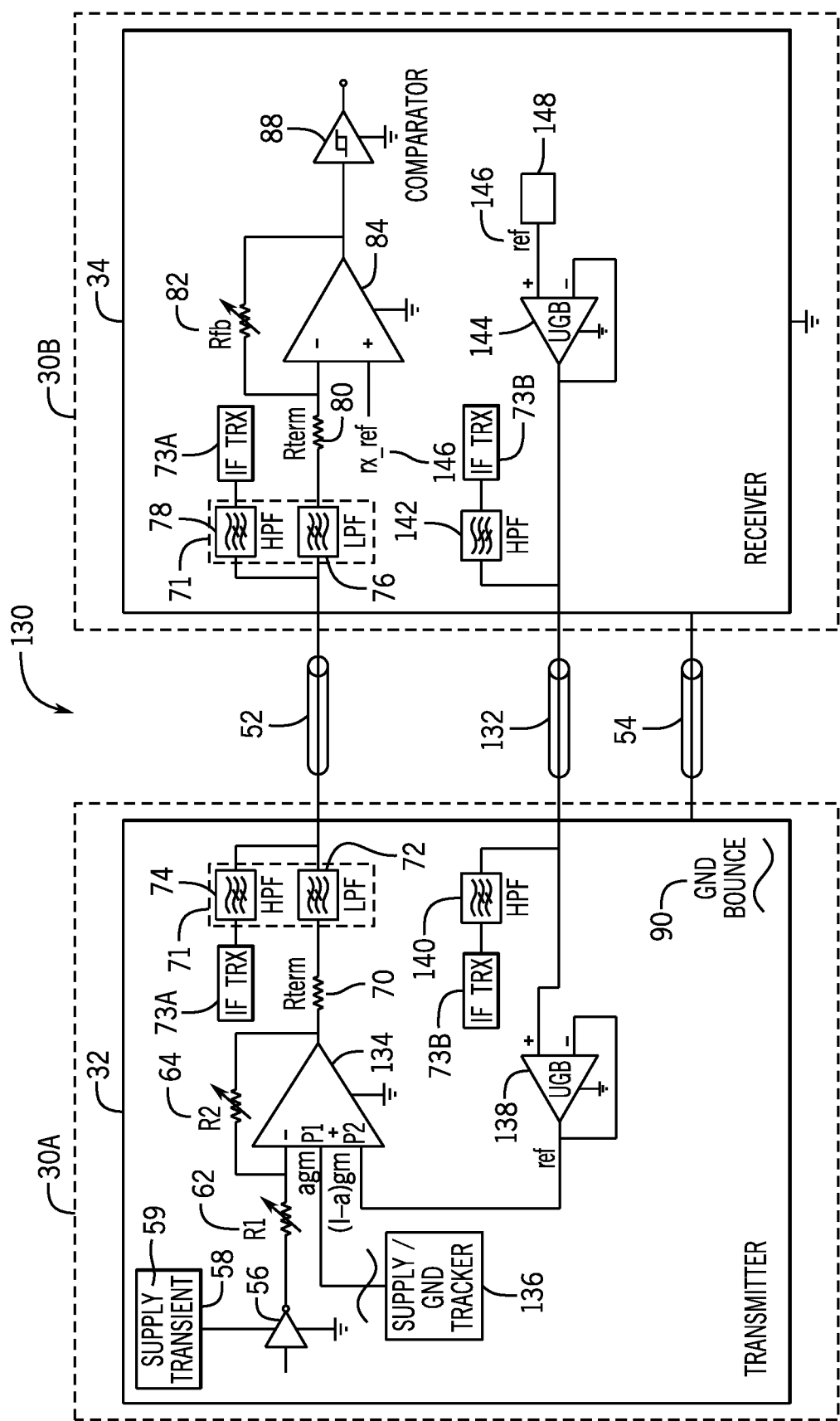
FIG. 6 is a schematic diagram of a communication system of FIG. 5 including diplexers in both the transceivers, according to embodiments of the present disclosure.

FIG. 6 is a schematic diagram of a communication system 130 of FIG. 5 including diplexers in both the transmitter 32 and receiver 34, according to embodiments of the present disclosure. That is, the communication system 130 of FIG. 6 is substantially similar to the communication system 130 of FIG. 6, but includes a diplexer 71 in each of the transmitter 32 and receiver 34. The diplexers 71 of FIG. 6 may be substantially similar to the diplexers 71 discussed with respect to FIG. 3. That is, the diplexer 71 of the transmitter 32 may receive an intermediate frequency transmission signal 73A (e.g., a data signal) and a control signal via the amplifier 134 and the termination resistor 70. In that case, the diplexer 71 may combine the signals and transmit the combined signal to the receiver 34 via the cable 52. The diplexer 71 of the receiver 34 may receive the combined signal and separate the data signal from the control signal via the cable 52. In that case, the control signal may pass through the low pass filter 76 and the data signal 73A may pass through the high pass filter 78. In some embodiments, the transmitter 32 and the receiver 34 may include a high pass filter 140, 142 respectively, to enable a data signal 73B to propagate therebetween via a different cable or connector, such as the reference voltage cable 132.

Figure 7:
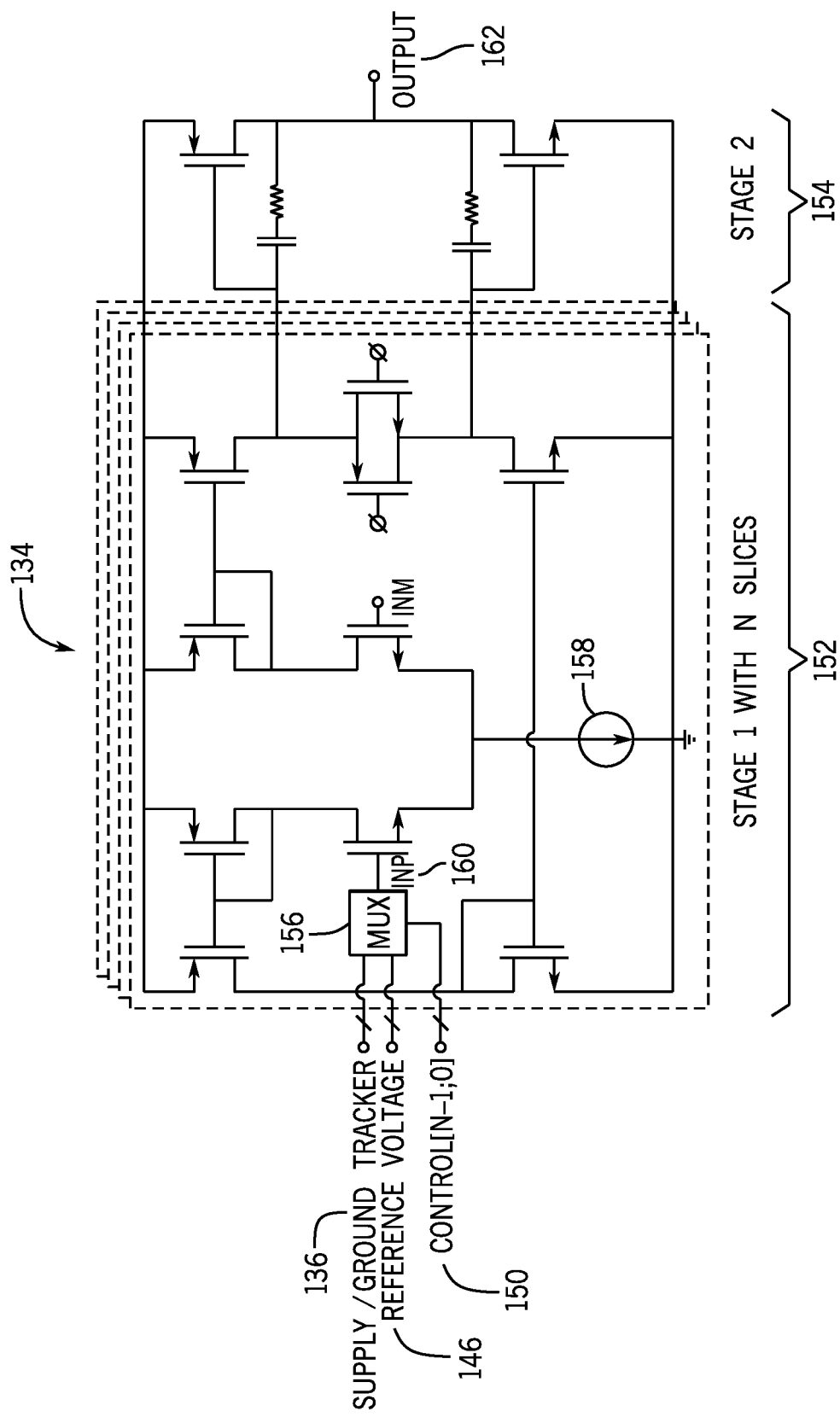
FIG. 7 is a schematic diagram of the amplifier of FIGS. 5 and 6, according to embodiments of the present disclosure.

FIG. 7 is a schematic diagram of the amplifier 134 of FIGS. 5 and 6, according to embodiments of the present disclosure. As shown, the amplifier 134 is a two-stage op-amp including a first stage 152 and a second stage 154. The stages 152, 154 may be amplification stages of the amplifier 134. The first stage 152 of the amplifier 134 is divided into a number (N) of slices. In some embodiments, the second stage 154 may be a Class AB amplifier with a Miller compensation capacitor and resistor.

Each slice of the first stage 152 receives of voltages: the voltage from the offset tracker 136 and the shared reference voltage 146. Further, each slice of the first stage 152 includes one or more current mirrors 158. A multiplexer 156 is connected to the positive input terminals P1 and P2, corresponding to the voltage from the offset tracker 136 and the shared reference voltage 146, respectively. The multiplexer 156 outputs a single positive signal Inp 160 to the first stage 152 of the amplifier 134 based on a control signal 150 that is N bits. The control signal 150 may enable the values of the offset tracker 136($a$) at the first positive terminal P1 of the amplifier 134 and the shared reference voltage 146 (1–a) at the second positive terminal P2 of the amplifier 134 to be programmed to cancel the DC offset.

In some embodiments, a first portion of the slices of the first stage 152 may be coupled to the offset tracker 136 and a second portion of the slices of the first stage 152 may be coupled to the shared reference voltage 146. In some embodiments, a smaller number of the slices of the first stage 152 may be coupled to the offset tracker 136 to cancel the DC offset, compared to the number of slices of the first stage 152 coupled to the shared reference voltage 146. For example, approximately one third of the number of slices of the first stage 152 may be coupled to the offset tracker 136 and approximately two thirds of the slices of the first stage 152 may be coupled to the shared reference voltage 146. In this way, the one third number of the slices of the first stage 152 may be coupled to the offset tracker 136 to cancel the DC offset, compared to the two thirds of the slices of the first stage 152 coupled to the shared reference voltage 146. An output 162 of the amplifier 134 may be coupled to the intermediate frequency cable 52 of FIGS. 5 and 6.

Figure 8:
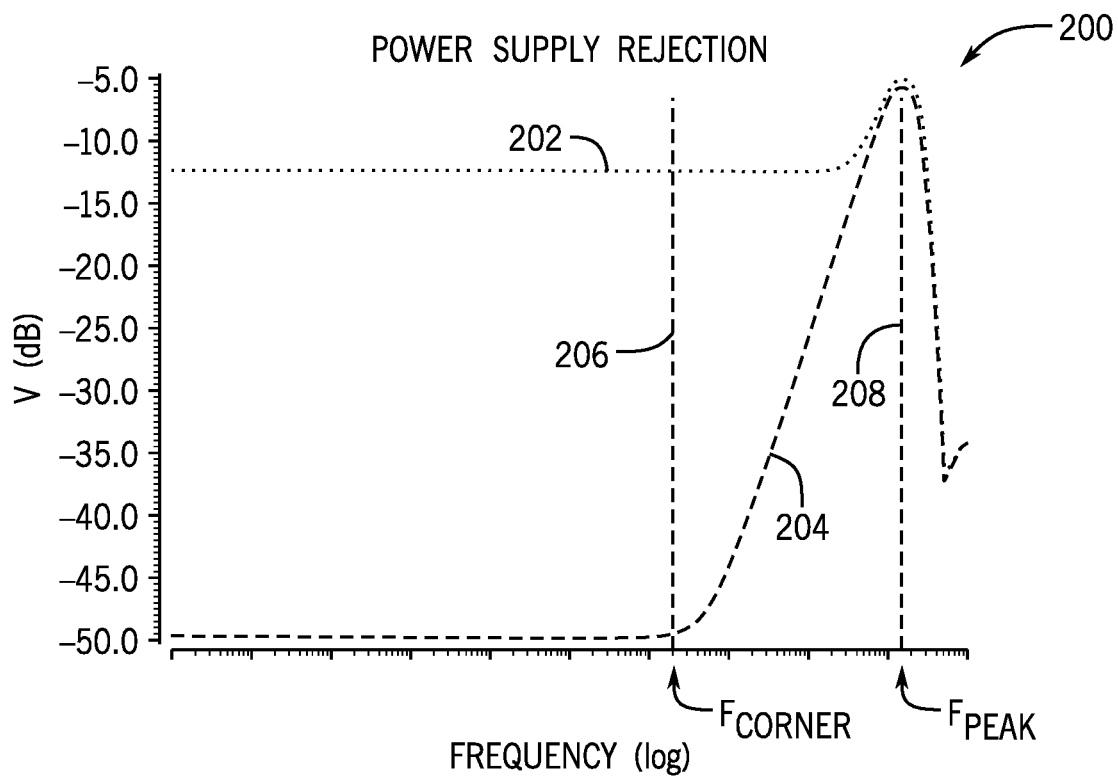
FIG. 8 is a graph illustrating a power supply rejection of the communication systems of FIGS. 3, 5, and 6.

FIG. 8 is a graph illustrating a power supply rejection 200 of the communication systems 50, 130 of FIGS. 3 and 5. The graph includes a horizontal axis representing frequency on a logarithmic scale, and a vertical axis representing a power supply rejection ratio (e.g., a ratio of change in supply voltage to output voltage). Specifically, the graph includes a first line 202 depicting a power supply rejection of approximately −12 decibels (dB) for the communication system 50 of FIG. 3 and a second line 204 depicting a power supply rejection of approximately −50 dB for the communication system 130 of FIGS. 5 and 6, prior to a corner frequency 206. That is, the communication system 130 of FIGS. 5 and 6, including the shared reference voltage 146 and the offset tracker 136, provides approximately a 40 dB improvement in the power supply rejection as compared to the communication system 50 of FIG. 3 using separate TX and RX reference voltages 68, 86, prior to the corner frequency 206. After the corner frequency 206, the power supply rejection 204 of the communication system 130 of FIGS. 5 and 6 approaches the power supply rejection 202 of the communication system 50 of FIG. 3, ultimately matching it at peak frequency 208. The corner frequency 206 may be configured to be any suitable frequency, such as 500 kilohertz (kHz) or less, 1 megahertz (MHz) or less, 10 MHz or less, greater than 10 MHz, and so on. Similarly, the peak frequency 208 may be configured to be any suitable frequency, such as 10 MHz or less, 100 MHz or less, 1 GHz or less, greater than 1 GHz, and so on. Thus, the shared reference voltage 146 and/or the offset tracker 136 of FIGS. 5 and 6 reduce the power supply variation (e.g., transient), thus reducing the DC offset of the communication system 130 of FIGS. 5 and 6 as compared to the communication system 50 of FIG. 3. Moreover, the shared reference voltage 146 and/or the offset tracker 136 of FIGS. 5 and 6 may target reducing the power supply variation at lower frequencies (e.g., lower than the configurable corner frequency 206) for greater effectiveness.

Figure 9:
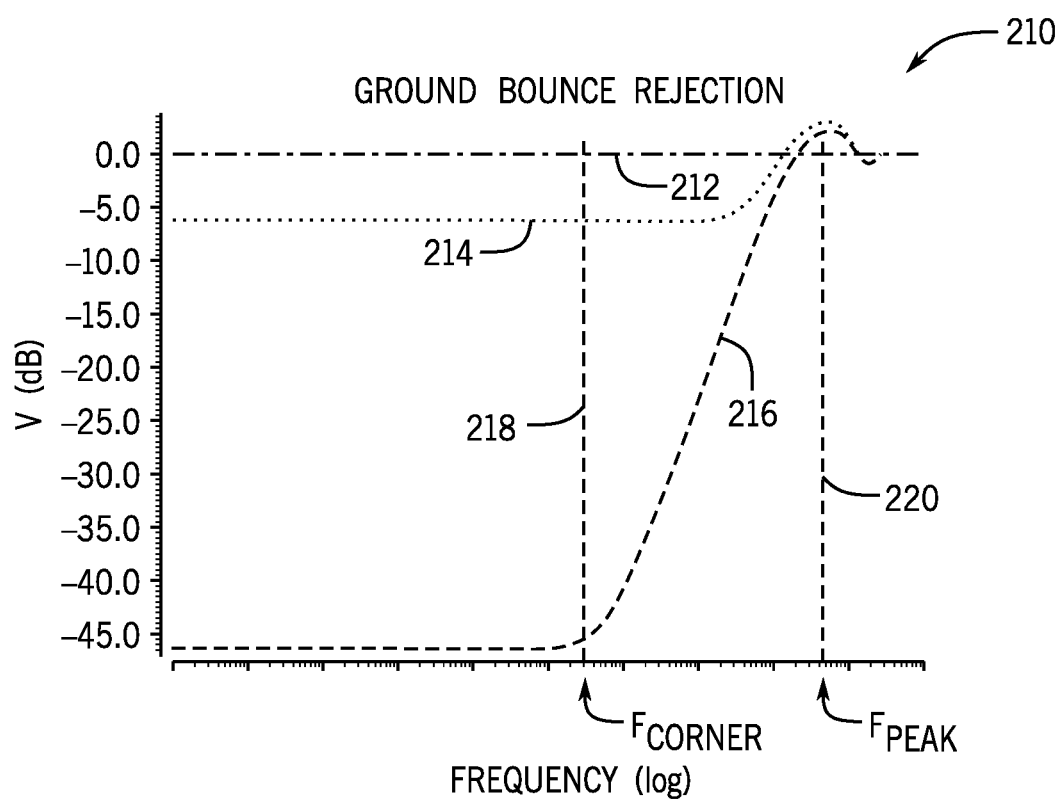
FIG. 9 is a graph illustrating a ground bounce rejection of the communication systems of FIGS. 3, 5, and 6.

FIG. 9 is a graph illustrating a ground bounce rejection 210 of the communication systems 50, 130 of FIG. 3 and FIGS. 5 and 6. The graph includes a horizontal axis representing frequency on a logarithmic scale, and a vertical axis representing a ground bounce rejection ratio (e.g., a ratio of change in ground voltage to output voltage). Specifically, the graph includes a first line 212 depicting a ground bounce rejection of approximately 0 (zero) decibels (dB) for the communication system 50 of FIG. 3 utilizing separate TX and RX reference voltages 68, 86 (and without the offset tracker 136 of FIGS. 5 and 6). A second line 214 depicts a ground bounce rejection of approximately −6 dB for the communication system 130 of FIGS. 5 and 6 using the shared reference voltage 146, but without the offset tracker 136, prior to a corner frequency 218. A third line 216 depicts a ground bounce rejection of about −46 dB for the communication system 130 of FIGS. 5 and 6 using the shared reference voltage 146 and the offset tracker 136, prior to the corner frequency 218. After the corner frequency 218, the ground bounce rejections 214, 216 of the communication system 130 of FIGS. 5 and 6 without and with the offset tracker 136, respectively, approach the power supply rejection 212 of the communication system 50 of FIG. 3, ultimately matching it at peak frequency 220. The corner frequency 218 may be configured to be any suitable frequency, such as 10 kHz or less, 100 kHz or less, 1 MHz or less, greater than 1 MHz, and so on. Similarly, the peak frequency 220 may be configured to be any suitable frequency, such as 10 MHz or less, 100 MHz or less, 1 GHz or less, greater than 1 GHz, and so on.

As such, a ground bounce rejection (e.g., depicted by the second line 214) of the communication system 130 of FIGS. 5 and 6 may be improved (e.g., reduced) using the shared reference voltage 146 (but not the offset tracker 136) by about 6 dB prior to the corner frequency 218, compared to the communication system 50 of FIG. 3 using the separate TX and RX reference voltages 68, 86. Further, the ground bounce rejection (e.g., depicted by the third line 216) of the communication system 130 of FIGS. 5 and 6 may be improved (e.g., reduced) using the shared reference voltage 146 and the offset tracker 136 by about 45 dB, compared to the communication system 50 of FIG. 3 using the separate TX and RX reference voltages 68, 86 and without the offset tracker 136 of the communication system 130 of FIGS. 5 and 6. Moreover, the shared reference voltage 146 and/or the offset tracker 136 of FIGS. 5 and 6 may target reducing the ground bounce variation at lower frequencies (e.g., lower than the configurable corner frequency 218) for greater effectiveness.

Advantageously, embodiments presented herein provide apparatus and techniques to reduce a DC offset and thus improve or maintain a low latency and a low bit error rate (BER) without additional protocol complexity or hardware overhead. Specifically, embodiments presented herein may reduce a DC offset caused by a reference voltage mismatch, a supply variation (transient), a ground bounce, and the like. To do so, embodiments herein include a shared reference voltage between a transmitter and a corresponding receiver, a multi-input operational amplifier, and a supply/ground tracker.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. An electronic device comprising:
 a receiver comprising a first unit gain buffer configured to receive a reference voltage signal;
 a transmitter comprising
  a second unit gain buffer coupled to the first unit gain buffer of the receiver,
  an amplifier comprising
   an input resistor,
   a feedback resistor,
   a first positive input configured to receive the reference voltage signal via the first unit gain buffer and the second unit gain buffer, and
   a negative input coupled to the input resistor and the feedback resistor, and
 a connector coupling the first unit gain buffer of the receiver to the second unit gain buffer of the transmitter.

2. The electronic device of claim 1, wherein the transmitter comprises an offset tracker coupled to a second positive input of the amplifier.

3. The electronic device of claim 2, wherein the offset tracker is configured to compensate for a direct current offset voltage caused by a supply variation of a power supply signal received by the amplifier and a ground bounce.

4. The electronic device of claim 2, wherein the amplifier comprises a first set of amplification stages coupled to the offset tracker and a second set of amplification stages configured to receive the reference voltage signal.

5. The electronic device of claim 1, wherein the negative input is configured to receive an input value based on a first resistance of the input resistor and a second resistance of the feedback resistor.

6. The electronic device of claim 1, wherein the receiver comprises a first high pass filter coupled to the first unit gain buffer, and the transmitter further comprises a second high pass filter coupled to the second unit gain buffer.

7. The electronic device of claim 1, wherein the second unit gain buffer is configured to receive the reference voltage signal via the first unit gain buffer.

8. A transmitter, comprising:
 a first unit gain buffer coupled to a second unit gain buffer of a receiver via a coupling; and
 an amplifier comprising
  a first input coupled to the second unit gain buffer,
  a multiplexer, and
  a set of amplification stages, the multiplexer configured to enable the set of amplification stages to receive a reference voltage signal from the receiver.

9. The transmitter of claim 8, comprising an offset tracker coupled to a second input of the amplifier and configured to compensate for an offset voltage caused at least in part by a variation of a power supply signal and a ground bounce.

10. The transmitter of claim 9, wherein the amplifier comprises an additional set of amplification stages, the multiplexer configured to couple the additional set of amplification stages to the offset tracker.

11. The transmitter of claim 10, wherein the set of amplification stages comprises a first number of amplification stages, the additional set of amplification stages comprises a second number of amplification stages, and the first number of amplification stages is greater than the second number of amplification stages.

12. The transmitter of claim 10, wherein an output of the multiplexer is based on a control signal used to program an output of the offset tracker to compensate for the offset voltage.

13. The transmitter of claim 9, wherein the offset tracker is configured to compensate for at least a portion of the offset voltage.

14. The transmitter of claim 9, wherein the first input and the second input of the amplifier comprise positive inputs of the amplifier.

15. An electronic device, comprising:
- a first integrated circuit comprising a receiver, the receiver comprising a first unit gain buffer configured to receive a reference voltage signal;
- a second integrated circuit comprising a transmitter, the transmitter comprising
  - a power supply,
  - a second unit gain buffer,
  - an amplifier coupled to the second unit gain buffer and configured to receive a power supply signal from the power supply, the amplifier comprising a first set of amplification stages configured to receive the reference voltage signal, and
- a connector coupling the first integrated circuit to the second integrated circuit, the second unit gain buffer configured to receive the reference voltage signal from the first integrated circuit via the connector.

16. The electronic device of claim 15, wherein the transmitter comprises an offset tracker coupled to the amplifier and configured to compensate for a direct current voltage offset caused by at least a variation in the power supply signal.

17. The electronic device of claim 16, wherein the amplifier comprises a second set of amplification stages coupled to the offset tracker.

18. The electronic device of claim 16, wherein the amplifier comprises a multiplexer and a second set of amplification stages configured to receive a signal from the offset tracker.

19. The electronic device of claim 18, wherein the multiplexer is configured to couple the first set of amplification stages to enable the first set of amplification stages to receive the reference voltage signal via the second unit gain buffer and enable the second set of amplification stages to receive the signal from the offset tracker.

20. The electronic device of claim 15, wherein the receiver comprises a first high pass filter coupled to the first unit gain buffer, and the transmitter comprises a second high pass filter coupled to the second unit gain buffer.

\* \* \* \* \*